(12) United States Patent
Basker et al.

(10) Patent No.: US 8,592,290 B1
(45) Date of Patent: *Nov. 26, 2013

(54) CUT-VERY-LAST DUAL-EPI FLOW

(75) Inventors: Veeraraghavan S. Basker, Schenectady, NY (US); Huiming Bu, Millwood, NY (US); Kangguo Cheng, Schenectady, NY (US); Balasubramanian S. Haran, Watervilet, NY (US); Nicolas Loubet, Guilderland, NY (US); Shom Ponoth, Clifton Park, NY (US); Stefan Schmitz, Malta, NY (US); Theodorus E. Standaert, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/545,456

(22) Filed: Jul. 10, 2012

Related U.S. Application Data

(63) Continuation of application No. 13/487,413, filed on Jun. 4, 2012.

(51) Int. Cl.
*H01L 21/20* (2006.01)

(52) U.S. Cl.
USPC ........... 438/478; 438/231; 438/257; 438/300; 257/328; 257/330; 257/347; 257/368; 257/E21.422

(58) Field of Classification Search
None
See application file for complete search history.

(56) References Cited

U.S. PATENT DOCUMENTS

| | | | | |
|---|---|---|---|---|
| 6,987,289 | B2 | 1/2006 | Nowak | 257/154 |
| 7,187,046 | B2 | 3/2007 | Wu et al. | 257/412 |
| 7,456,481 | B2 | 11/2008 | Inaba et al. | 257/401 |
| 7,709,893 | B2 | 5/2010 | Bauer et al. | 257/350 |
| 2011/0210393 | A1 | 9/2011 | Chen et al. | 257/347 |

OTHER PUBLICATIONS

U.S. Appl. No. 13/487,413, filed Jun. 4, 2012.*
V.S. Basker, et al., "A 0.063 um$^2$ FinFET SRAM Cell Demonstration With Conventional Lithography Using a Novel Integration Scheme With Aggressively Scaled Fin and Gate Pitch," 2010 Symposium on VLSI Technology (VLSIT), Jun. 15-17, 2010, pp. 19-20.

* cited by examiner

*Primary Examiner* — Kyoung Lee
(74) *Attorney, Agent, or Firm* — Harrington & Smith

(57) ABSTRACT

A method for making dual-epi FinFETs is described. The method includes adding a first epitaxial material to an array of fins. The method also includes covering at least a first portion of the array of fins using a first masking material and removing the first epitaxial material from an uncovered portion of the array of fins. Adding a second epitaxial material to the fins in the uncovered portion of the array of fins is included in the method. The method also includes covering a second portion of the array of fins using a second masking material and performing a directional etch using the first masking material and the second masking material. Apparatus and computer program products are also described.

20 Claims, 11 Drawing Sheets

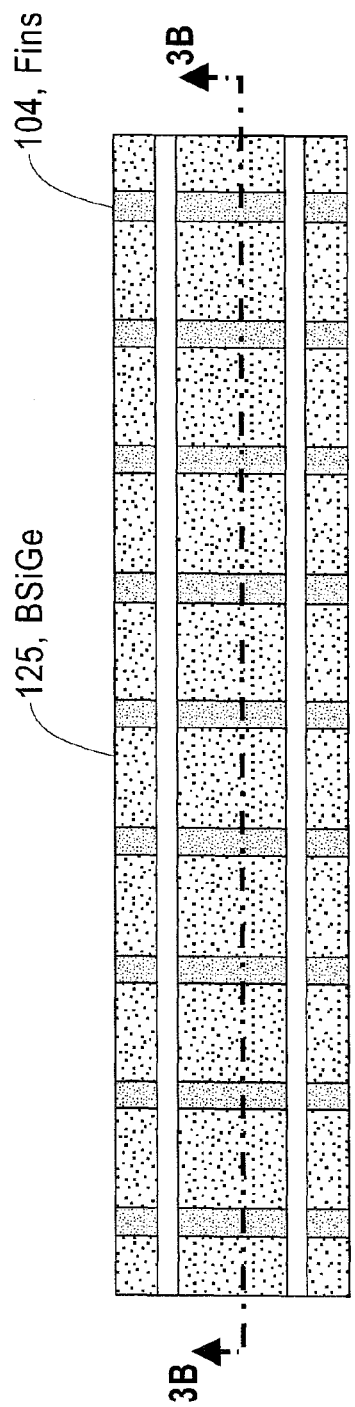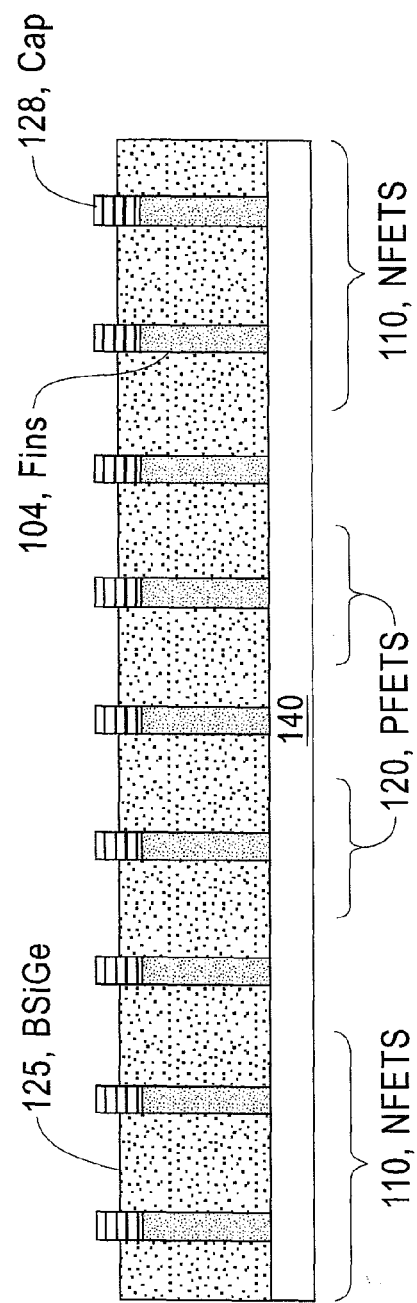
FIG. 3A
FIG. 3B

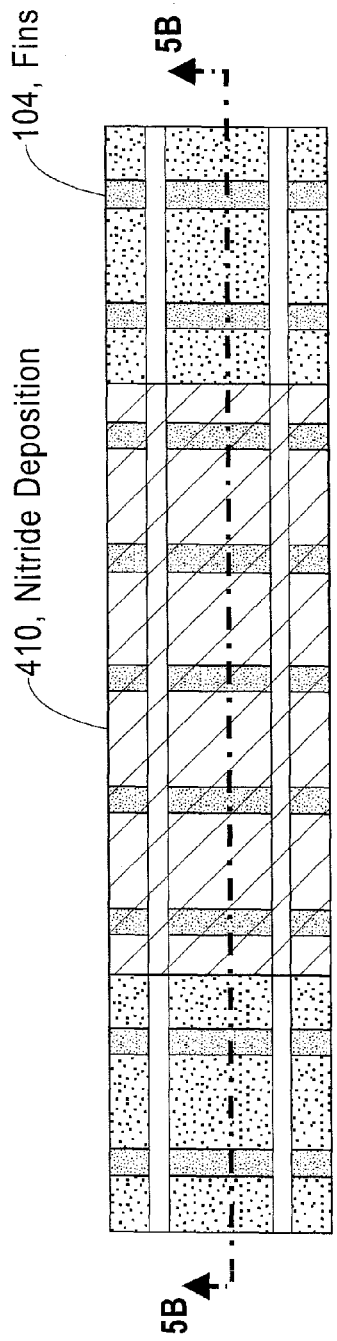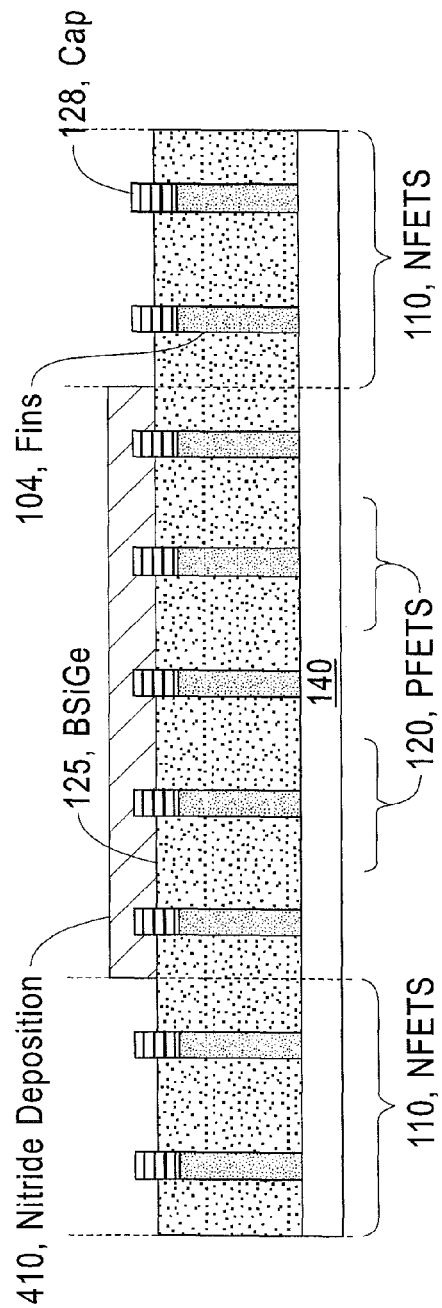
FIG. 5A
FIG. 5B

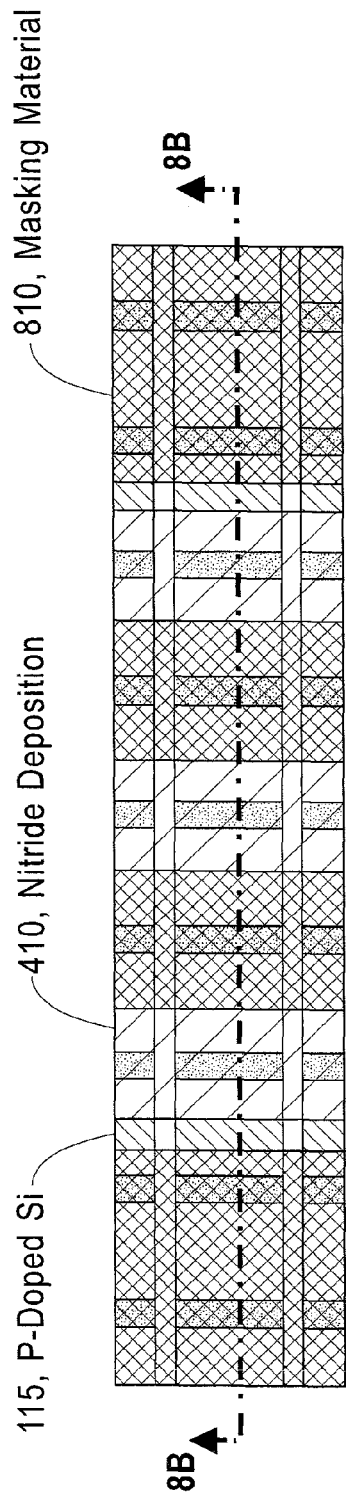
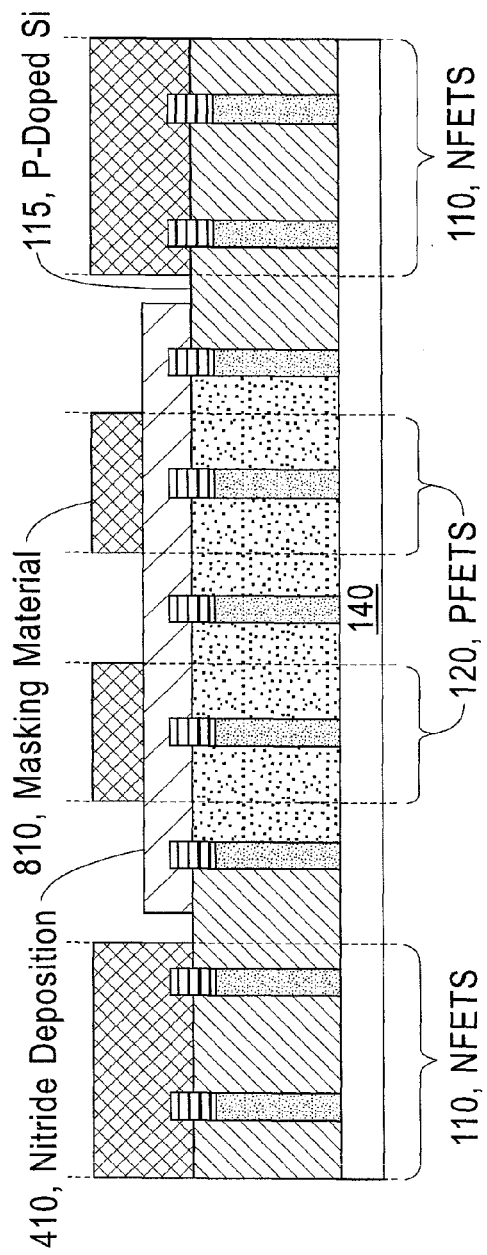
FIG. 8A
FIG. 8B

CUT-VERY-LAST DUAL-EPI FLOW

CROSS-REFERENCE TO RELATED APPLICATIONS

This patent application is a continuing application of U.S. application Ser. No. 13/487,413, filed Jun. 4, 2012, the disclosure of which is incorporated by reference herein in its entirety.

TECHNICAL FIELD

The exemplary embodiments of this invention relate generally to field effect transistors (FETs) and, more specifically, relate to dual-epi FETs.

BACKGROUND

This section is intended to provide a background or context. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Semiconductors and integrated circuit chips have become ubiquitous within many products due to their continually decreasing cost and size. In the microelectronics industry as well as in other industries involving construction of microscopic structures (such as micromachines, magnetoresistive heads, etc.) there is a continued desire to reduce the size of structural features and microelectronic devices and/or to provide a greater amount of circuitry for a given chip size. Miniaturization, in general, allows for increased performance (more processing per clock cycle and less heat generated) at lower power levels and lower cost. Present technology is at or approaching atomic level scaling of certain micro-devices such as logic gates, FETs and capacitors. Circuit chips with hundreds of millions of such devices are not uncommon. Further size reductions appear to be approaching the physical limit of trace lines and micro-devices that are embedded upon and within their semiconductor substrates.

BRIEF SUMMARY

In an exemplary aspect a method includes adding a first epitaxial material to an array of fins. The method also includes covering at least a first portion of the array of fins using a first masking material and removing the first epitaxial material from an uncovered portion of the array of fins. Adding a second epitaxial material to the fins in the uncovered portion of the array of fins is included in the method. The method also includes covering a second portion of the array of fins using a second masking material and performing a directional etch using the first masking material and the second masking material.

In another exemplary aspect an apparatus includes a processor and a memory storing program instructions. The memory and the program instructions are configured to, with the processor, cause the apparatus to perform actions. The actions include adding a first epitaxial material to an array of fins. The actions also include covering at least a first portion of the array of fins using a first masking material and removing the first epitaxial material from an uncovered portion of the array of fins. Adding a second epitaxial material to the fins in the uncovered portion of the array of fins is included in the actions. The actions also include covering a second portion of the array of fins using a second masking material and performing a directional etch using the first masking material and the second masking material.

In a further exemplary aspect a computer program product includes program instructions embodied on a tangible computer-readable medium, execution of the program instructions resulting in operations. The operations include adding a first epitaxial material to an array of fins. The operations also include covering at least a first portion of the array of fins using a first masking material and removing the first epitaxial material from an uncovered portion of the array of fins. Adding a second epitaxial material to the fins in the uncovered portion of the array of fins is included in the operations. The operations also include covering a second portion of the array of fins using a second masking material and performing a directional etch using the first masking material and the second masking material.

In another exemplary aspect an apparatus includes means for adding a first epitaxial material to an array of fins. The apparatus also includes means for covering at least a first portion of the array of fins using a first masking material and means for removing the first epitaxial material from an uncovered portion of the array of fins. Means for adding a second epitaxial material to the fins in the uncovered portion of the array of fins is included in the apparatus. The apparatus also includes means for covering a second portion of the array of fins using a second masking material and means for performing a directional etch using the first masking material and the second masking material.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein:

FIGS. 3A and 3B, collectively referred to as FIG. 3, illustrate a top-down view (FIG. 3A) and a cross-section view (FIG. 3B) of the FinFETs during another stage of creation in accordance with an exemplary embodiment.

FIGS. 5A and 5B, collectively referred to as FIG. 5, illustrate a top-down view (FIG. 5A) and a cross-section view (FIG. 5B) of the FinFETs during another stage of creation in accordance with an exemplary embodiment.

FIGS. 8A and 8B, collectively referred to as FIG. 8, illustrate a top-down view (FIG. 8A) and a cross-section view (FIG. 8B) of the FinFETs during a further stage of creation in accordance with an exemplary embodiment.

DETAILED DESCRIPTION

Figure 1A:
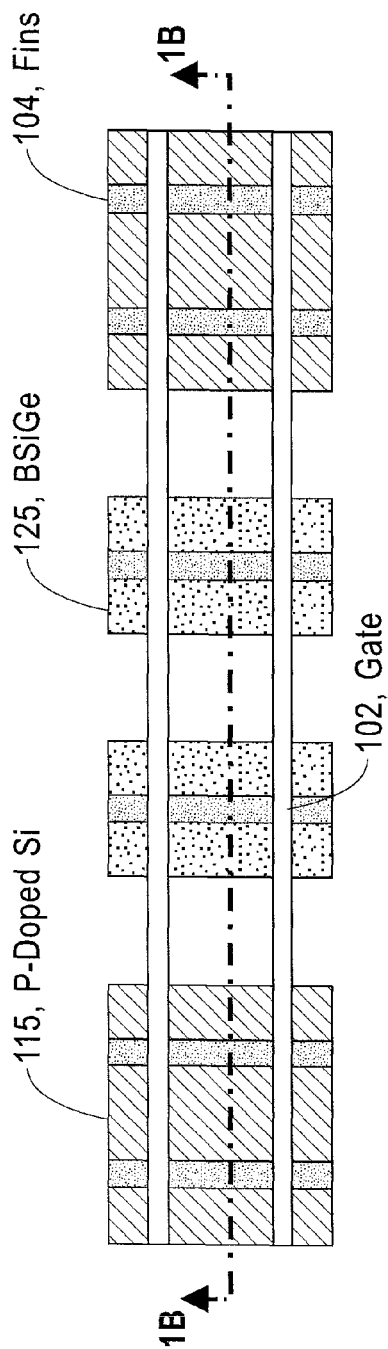
FIGS. 1A and 1B, collectively referred to as FIG. 1, illustrate a top-down view (FIG. 1A) and a cross-section view (FIG. 1B) of fin FETs created in accordance with an exemplary embodiment.

The following abbreviations that may be found in the specification and/or the drawing figures are defined as follows:
B-SiGe boron-doped silicon-germanium
CMOS complementary metal-oxide semiconductor
epi epitaxial/epitaxy
FET field effect transistor
HCl hydrogen chloride
MOS metal-oxide semiconductor
NFET n-type FET
PFET p-type FET
SIT sidewall image transfer
SOI silicon-on-insulator A field effect transistor (FET) is a transistor having a source, a gate, and a drain. The action of the FET depends on the flow of majority carriers along a channel between the source and drain that runs past the gate. Current through the channel, which is between the source and drain, may be controlled by a transverse electric field under the gate.

As known to those skilled in the art, P-type FETs (PFETs) turn ON to allow current flow from source to drain when the gate terminal is at a low or negative potential with respect to the source. When the gate potential is positive or the same as the source, the P-type FET is OFF, and does not conduct current. On the other hand, N-type FETs (NFETs) turn ON to allow current flow from source to drain when the gate terminal is high or positive with respect to the source. When the gate potential is negative or the same as the source, the N-type FET is OFF, and does not conduct current. Note that in each of these cases there is a threshold voltage (such as at the gate terminal) for triggering actuation of the FET.

More than one gate (multi-gate) can be used to more effectively control the channel. The length of the gate determines how fast the FET switches, and can be about the same as the length of the channel (such as the distance between the source and drain). Multi-gate FETs are considered to be promising candidates to scale down complementary metal-oxide semiconductor (CMOS) FET technology. However, such small dimensions necessitate greater control over performance issues such as short channel effects, punch-through, metal-oxide semiconductor (MOS) leakage current and the parasitic resistance that is present in a multi-gate FET.

The size of FETs has been successfully reduced through the use of one or more fin-shaped channels. A FET employing such a channel structure may be referred to as a FinFET. Previously, CMOS devices were substantially planar along the surface of the semiconductor substrate, the exception being the FET gate that was disposed over the top of the channel. Fins break from this paradigm by using a vertical channel structure in order to maximize the surface area of the channel that is exposed to the gate. The gate controls the channel more strongly because it extends over more than one side (surface) of the channel. For example, the gate can enclose three surfaces of the three-dimensional channel, rather than being disposed only across the top surface of the traditional planar channel.

One technique for affecting the threshold voltage (such as increasing the threshold voltage, encouraging a more constant threshold voltage over different gate lengths) is to use locally implanted dopants under the gate edge(s). This is referred to as a "halo" implant. As non-limiting examples, the halo implant may include arsenic, phosphorous, boron and/or indium.

Silicon-on-insulator (SOI) wafers have been used to exploit the improved quality of monocrystalline silicon provided thereby in an active layer formed on an insulator over a bulk silicon "handling" substrate. Similar attributes can be developed in similar structures of other semiconductor materials and alloys thereof. The improved quality of the semiconductor material of the active layer allows transistors and other devices to be scaled to extremely small sizes with good uniformity of electrical properties.

An exemplary embodiment is a cut-very-last processing flow which enables dual-epi for FinFET. The epi-merge of the fins in the source/drain (S/D) regions is very challenging if independent epi control is used for NFET and PFET. In addition, independent epi control may require mitigation of any unwanted epi-shorting between devices in the SRAM. In contrast, the new processing flow is a single-mask solution enabling dual-epi and resolves any epi-shorting that might occur between various devices.

In the cut-very-last processing flow, dummy fins remain until the end of device fabrication and are cut in the last stage of the device fabrication (after source/drain formation). However, in a conventional finFET process, fins are defined by sidewall image transfer (SIT) and unwanted dummy fins are cut (removed) immediately following SIT. Device fabrication such as gate, spacer, source/drain are then formed after fin cut.

Figure 1B:
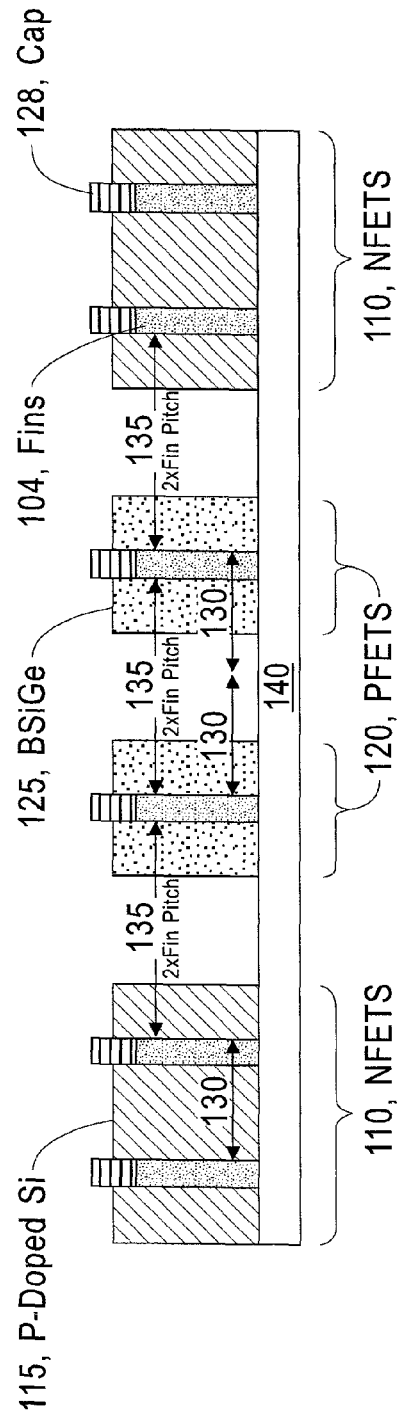

FIGS. 1A and 1B illustrate a non-limiting example of finFETs created in accordance with an exemplary embodiment. In the top-down view of FIG. 1A, NFETs 110 are shown with P-doped Si 115. The PFETs 120 have BSiGe 125. Layered on top of the FinFETs 110, 120 is gate 102.

Shown FIG. 1B (the cross-section view), the FinFETs 110, 120 are located on a substrate 140. Each FinFET includes a cap 128. The FinFETs 110, 120 are regularly spaced with the distance 135 between the PFETs 120 and their neighbor FinFET (either the other PFET 120 or an NFET 110) is twice the fin pitch 130 (or distance between adjacent fins of NFETs 110).

Figure 2A:
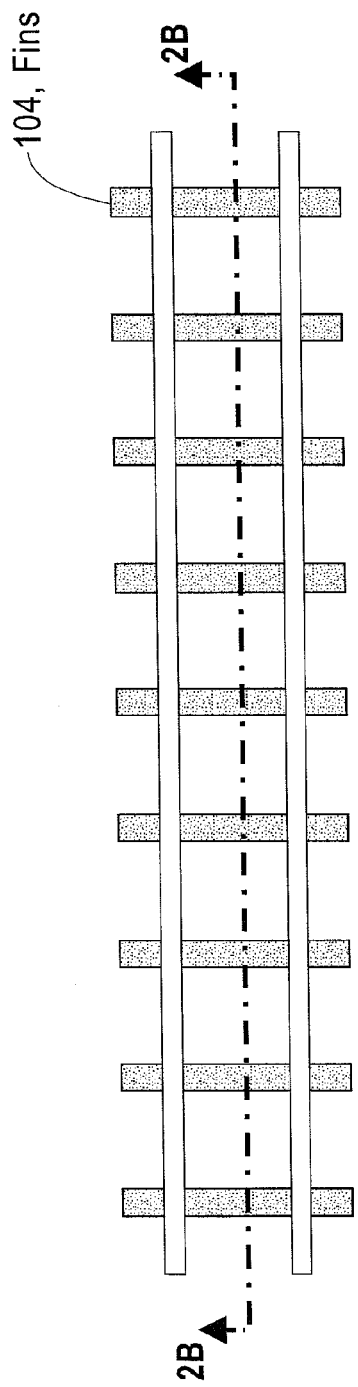
FIGS. 2A and 2B, collectively referred to as FIG. 2, illustrate a top-down view (FIG. 2A) and a cross-section view (FIG. 2B) of the FinFETs during a stage of creation in accordance with an exemplary embodiment.
Figure 2B:
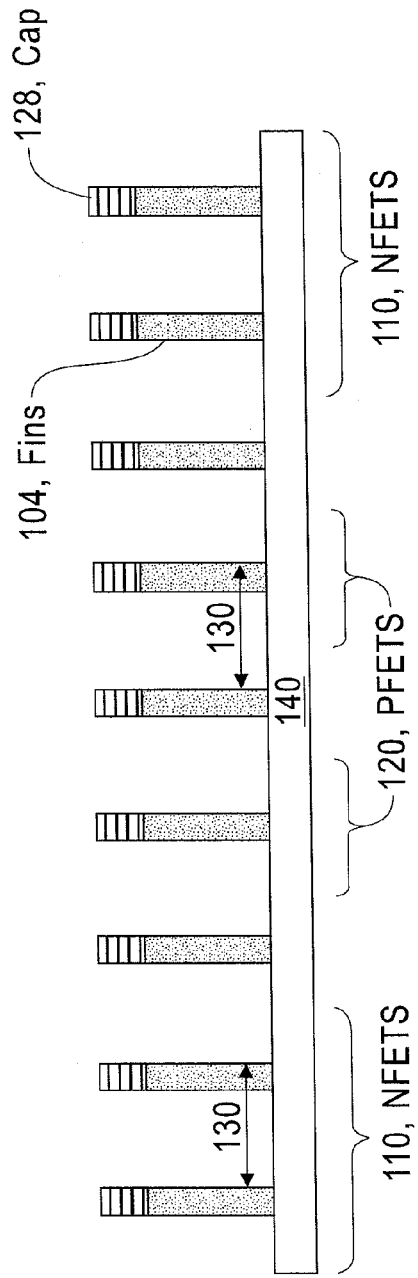

FIGS. 2A and 2B illustrate the finFETs 110, 120 during a stage of creation in accordance with an exemplary embodiment. At this stage, an array of fins 104 (which will become FinFETs 110, 120) is positioned on the substrate 140. A gate reactive ion etch (RIE) may be used to ensure the array of fins 104 is clean of unwanted debris. Note that for a regular array of fin 104, the fins 104 are evenly spaced such that the distance between adjacent fins (or fin pitch) 130 is the same for all fins 104.

FIGS. 3A and 3B illustrate the finFETs 110, 120 during another stage of creation in accordance with an exemplary embodiment. At this stage, a first epitaxial material (BSiGe 125) is added to merge all fins 104.

Figure 4A:
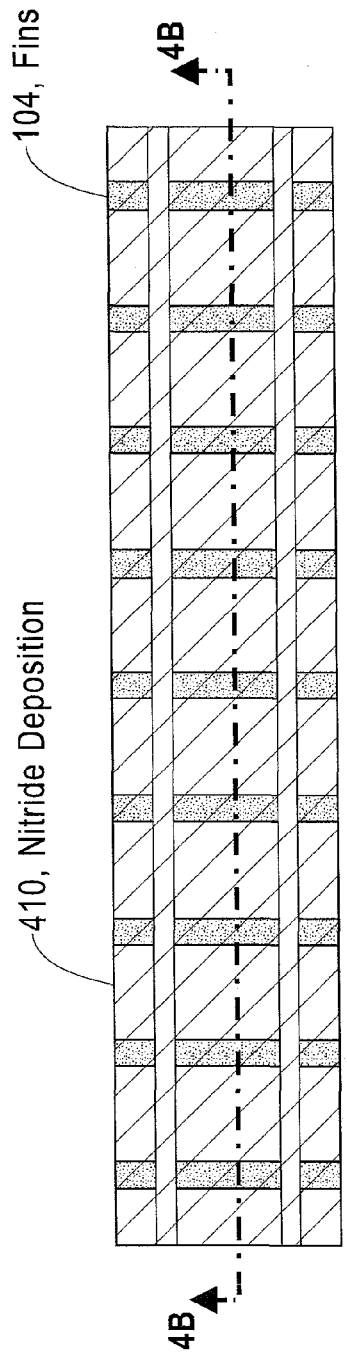
FIGS. 4A and 4B, collectively referred to as FIG. 4, illustrate a top-down view (FIG. 4A) and a cross-section view (FIG. 4B) of the FinFETs during a further stage of creation in accordance with an exemplary embodiment.
Figure 4B:
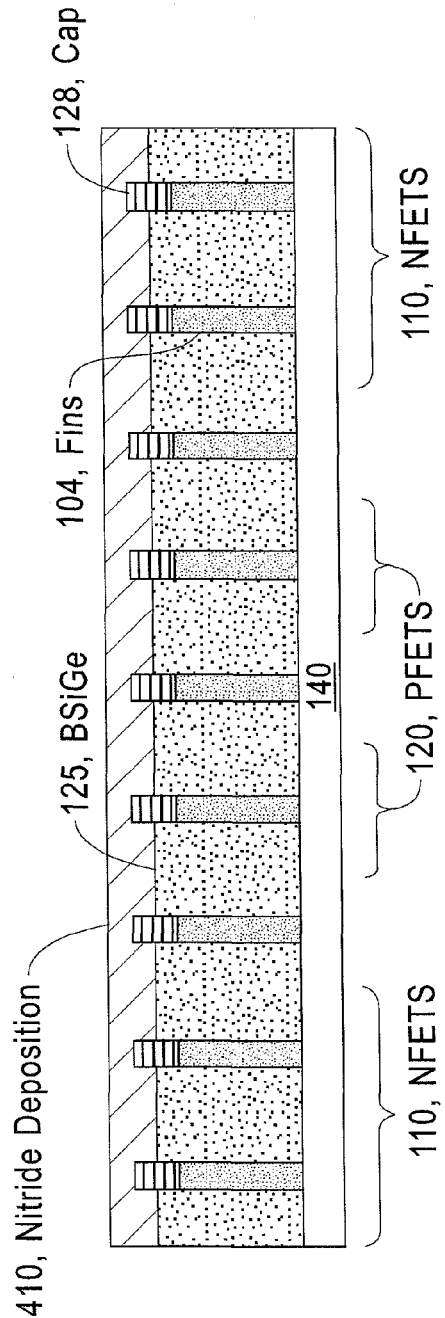

FIGS. 4A and 4B illustrate the finFETs 110, 120 during a further stage of creation in accordance with an exemplary embodiment. Here, a thin nitride deposition 410 is layered over the fins 104 and the BSiGe 125. This may be done using an in-situ radical assisted deposition (iRAD).

FIGS. 5A and 5B illustrate the finFETs 110, 120 during another stage of creation in accordance with an exemplary embodiment. At this stage, the NFET 110 areas are exposed by removing the nitride deposition 410 covering these areas.

Figure 6A:
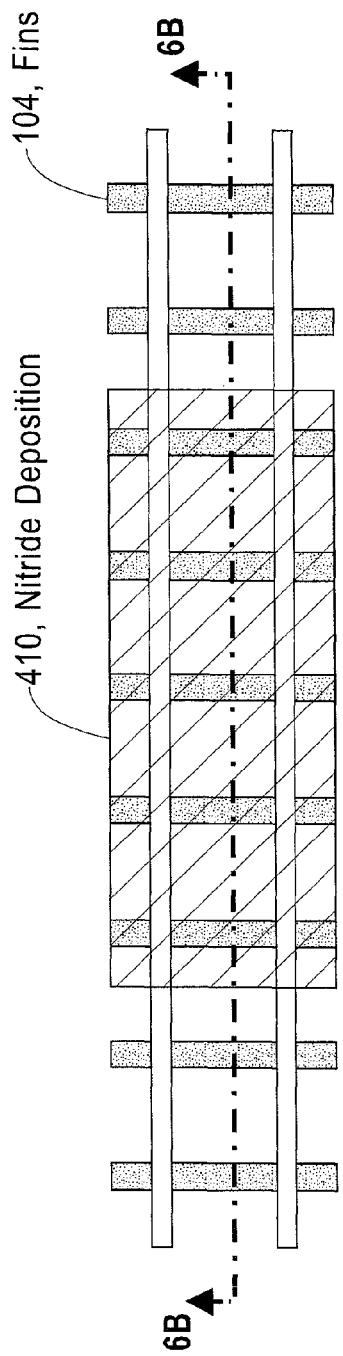
FIGS. 6A and 6B, collectively referred to as FIG. 6, illustrate a top-down view (FIG. 6A) and a cross-section view (FIG. 6B) of the FinFETs during a further stage of creation in accordance with an exemplary embodiment.
Figure 6B:
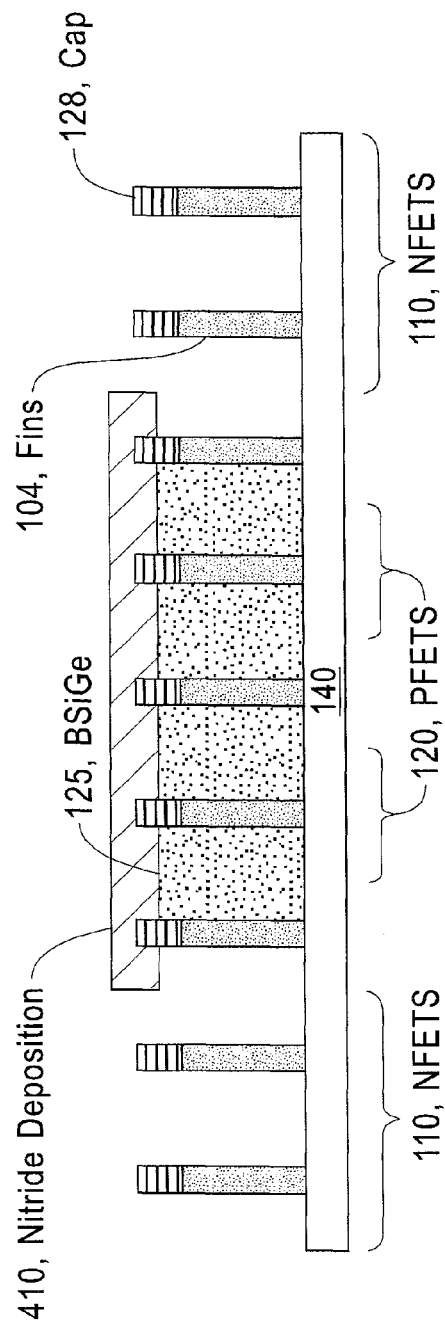

FIGS. 6A and 6B illustrate the finFETs 110, 120 during a further stage of creation in accordance with an exemplary embodiment. During this stage, the BSiGe 125 is removed from the exposed NFET 110 areas. As a non-limiting example, the BSiGe 125 may be removed using an HCl etch.

Figure 7A:
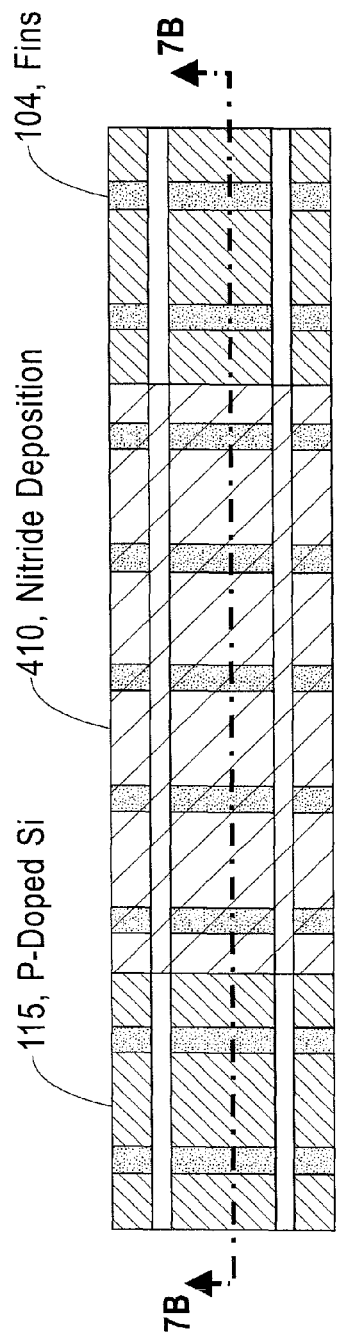
FIGS. 7A and 7B, collectively referred to as FIG. 7, illustrate a top-down view (FIG. 7A) and a cross-section view (FIG. 7B) of the FinFETs during another stage of creation in accordance with an exemplary embodiment.
Figure 7B:
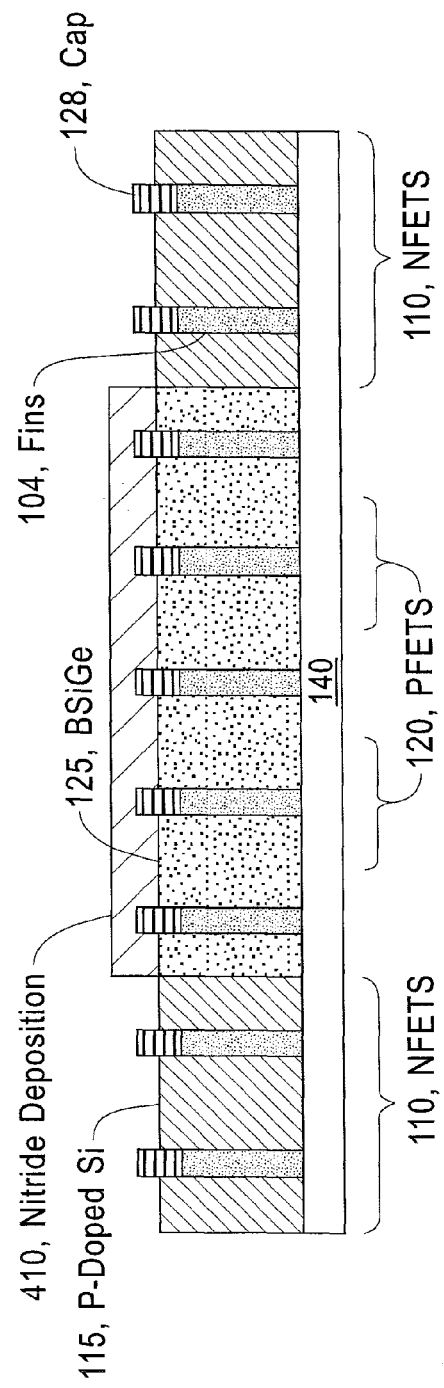

FIGS. 7A and 7B illustrate the finFETs 110, 120 during another stage of creation in accordance with an exemplary embodiment. Here, a second epitaxial material (P-doped Si-115) is added to merge the NFET 110 fins 104. Note that the stages shown in FIGS. 6 and 7 can be performed in a single step on epi-platform.

FIGS. 8A and 8B illustrate the finFETs 110, 120 during a further stage of creation in accordance with an exemplary embodiment. The active areas are defined by adding a masking material 810 which will protect some fins while unwanted dummy fins are not protected by this mask.

Figure 9A:
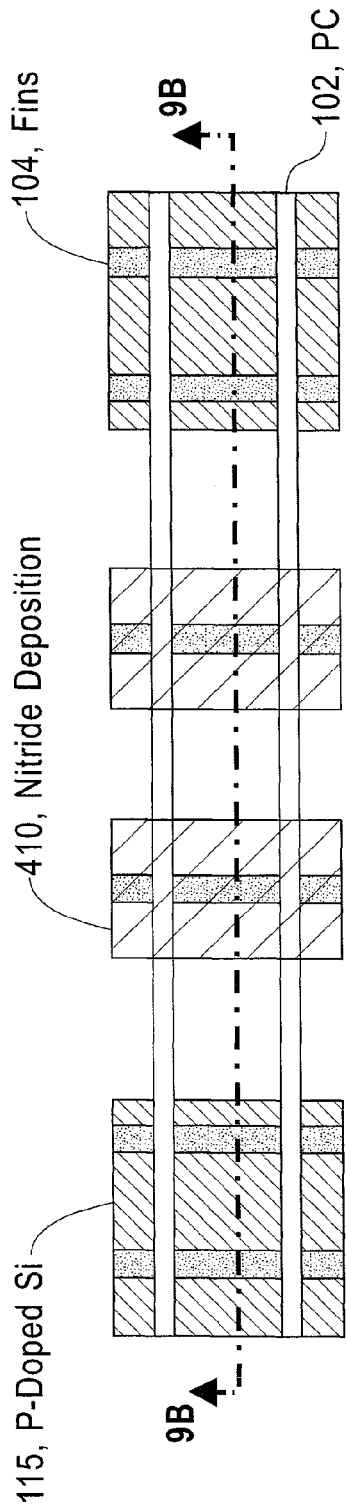
FIGS. 9A and 9B, collectively referred to as FIG. 9, illustrate a top-down view (FIG. 9A) and a cross-section view (FIG. 9B) of the FinFETs during another stage of creation in accordance with an exemplary embodiment.
Figure 9:
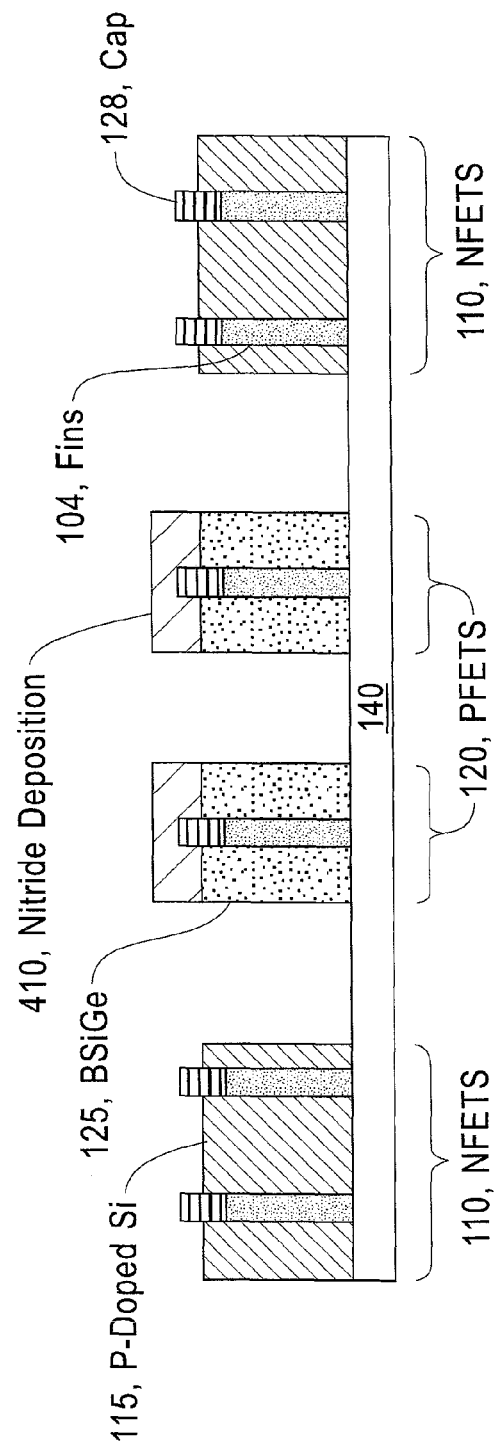

FIG. 9 illustrates the finFETs 110, 120 during another stage of creation in accordance with an exemplary embodiment. In this stage, a direction etch (or cut) is made using the masking material 810 (shown in FIGS. 8A and 8B) and the nitride deposition 410 as masking materials. This removes the non-active BSiGe 125, P-Doped Si 115 and some of the non-masked fins 104. The etch also removes the masking material 810 and the non-masked nitride deposition 410. The cut may (or may not) also remove a portion of the substrate 140.

Note that in a further exemplary embodiment the finFETs 110, 120 may be constructed with the locations of the PFETs 120 and NFETs 110 switched. Accordingly, the epitaxial material (such as BSiGe 125 and P-Doped Si 115) may also be switched as well as any accompanying changes to the masking material (masking material 810 and nitride deposition 410).

The epitaxial material (BSiGe 125 and P-Doped Si 115) may be of any type suitable to the local technical environment and may be implemented using any suitable technology. Likewise, the masking material (masking material 810 and nitride deposition 410) may be of any type suitable to the local technical environment and may be implemented using any suitable technology.

Figure 12A:
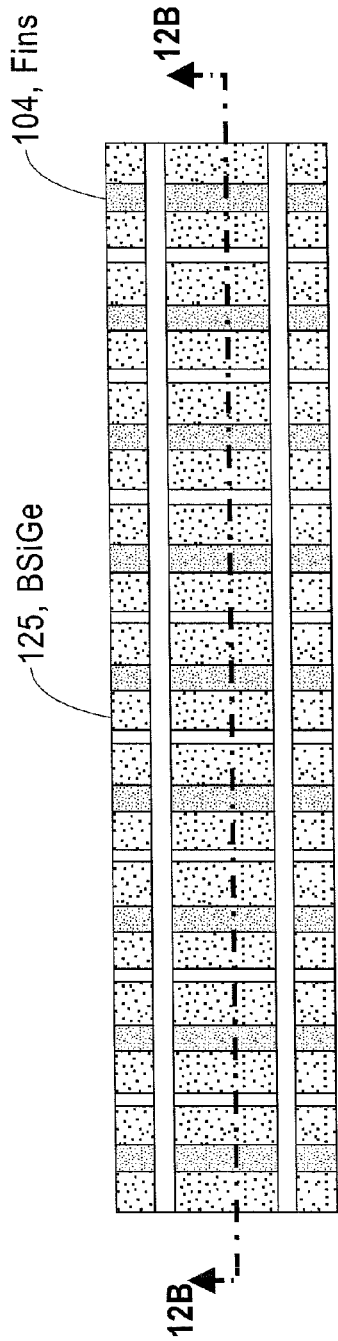
FIGS. 12A and 12B, collectively referred to as FIG. 12, illustrate a top-down view (FIG. 3A) and a cross-section view (FIG. 3B) of the FinFETs during an alternative stage of creation in accordance with an exemplary embodiment.
Figure 12B:
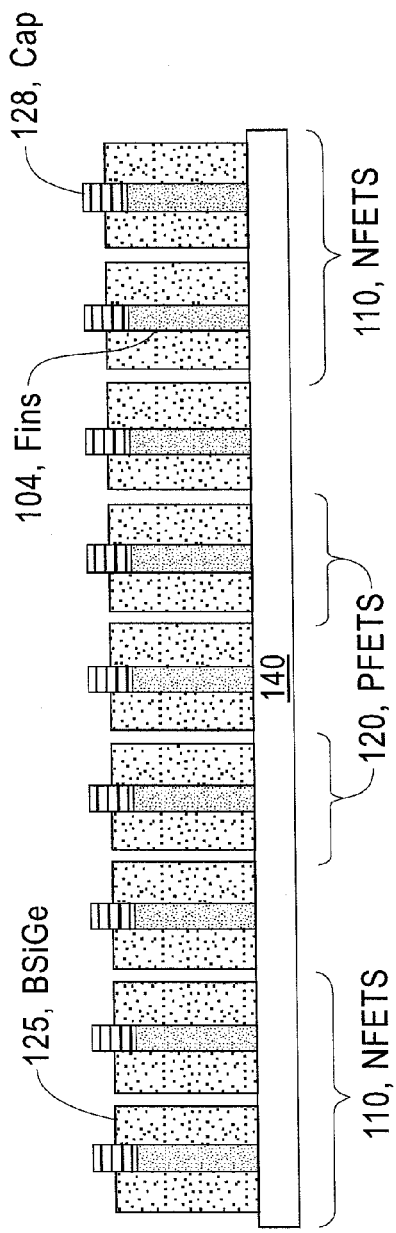

FIGS. 12A and 12B illustrate the finFETs 110, 120 during an alternative stage of creation in accordance with an exemplary embodiment. At this stage, which would replace the stage shown in FIGS. 3A and 3B, the first epitaxial material (BSiGe 125) is added to the fins 104. While the epitaxial growth is sufficient to be on the fins, the epitaxial material does not physically merge the fins.

In another embodiment, additional spacer material may be added to cover and isolate "dummy' channels underneath the gate that may remain after the cut. These channels are undoped and are invisible from a parasitic point of view.

By performing the cut last, this enables a uniform gate profile and extension across all fins. Accordingly, the voltage threshold (Vt) to width dependence is improved.

An exemplary cut-very-last process resolves unwanted epi-shorting between devices as well as wrap-around of epi at gate line-ends, especially SRAM. The cut-very-last approach uses dummy/sacrificial fins. These dummy fins are placed at every N-to-P transition (boundary between N-FETs and P-FETs). Thus, the spacing of pull-ups (PUs), pass-down and pass-gate devices in the SRAM is at 2× fin pitch.

The P-Doped S±115 may be slightly thicker for the NFET extension/P-doped Si; however, the lateral HCl etch provides minimal end-device impact. Additionally, the total spacer increase for the S/D may be accounted for.

Figure 10:
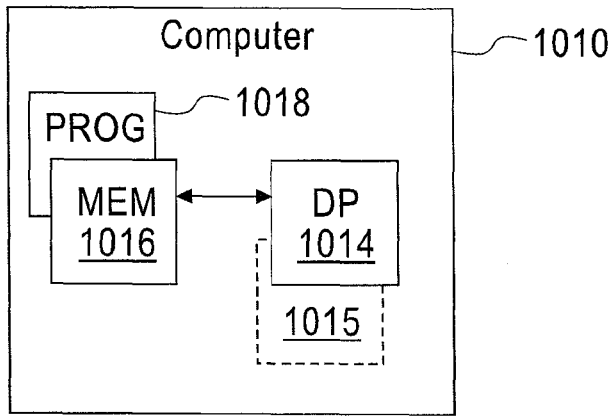
FIG. 10 shows a simplified block diagram of exemplary electronic devices that are suitable for use in practicing various exemplary embodiments.

Reference is made to FIG. 10 for illustrating a simplified block diagram of various electronic devices and apparatus that are suitable for use in practicing exemplary embodiments. For example, computer 1010 may be used to control a lithography process in accordance with an exemplary embodiment.

The computer 1010 includes a controller, such as a computer or a data processor (DP) 1014 and a computer-readable memory medium embodied as a memory (MEM) 1016 that stores a program of computer instructions (PROG) 1018.

The PROGs 1018 is assumed to include program instructions that, when executed by the associated DP 1014, enable the device to operate in accordance with exemplary embodiments, as will be discussed below in greater detail.

That is, various exemplary embodiments may be implemented at least in part by computer software executable by the DP 1014 of the computer 1010, or by hardware, or by a combination of software and hardware (and firmware).

The computer 1010 may also include dedicated processors, for example lithography controller 1015.

The computer readable MEM 1016 may be of any type suitable to the local technical environment and may be implemented using any suitable data storage technology, such as semiconductor based memory devices, flash memory, magnetic memory devices and systems, optical memory devices and systems, fixed memory and removable memory. The DP 1014 may be of any type suitable to the local technical environment, and may include one or more of general purpose computers, special purpose computers, microprocessors, digital signal processors (DSPs) and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise steps of utilizing the exemplary embodiments or steps of the method.

Based on the foregoing it should be apparent that various exemplary embodiments provide a method, apparatus and computer program(s) to make dual-epi FinFETs.

Figure 11:
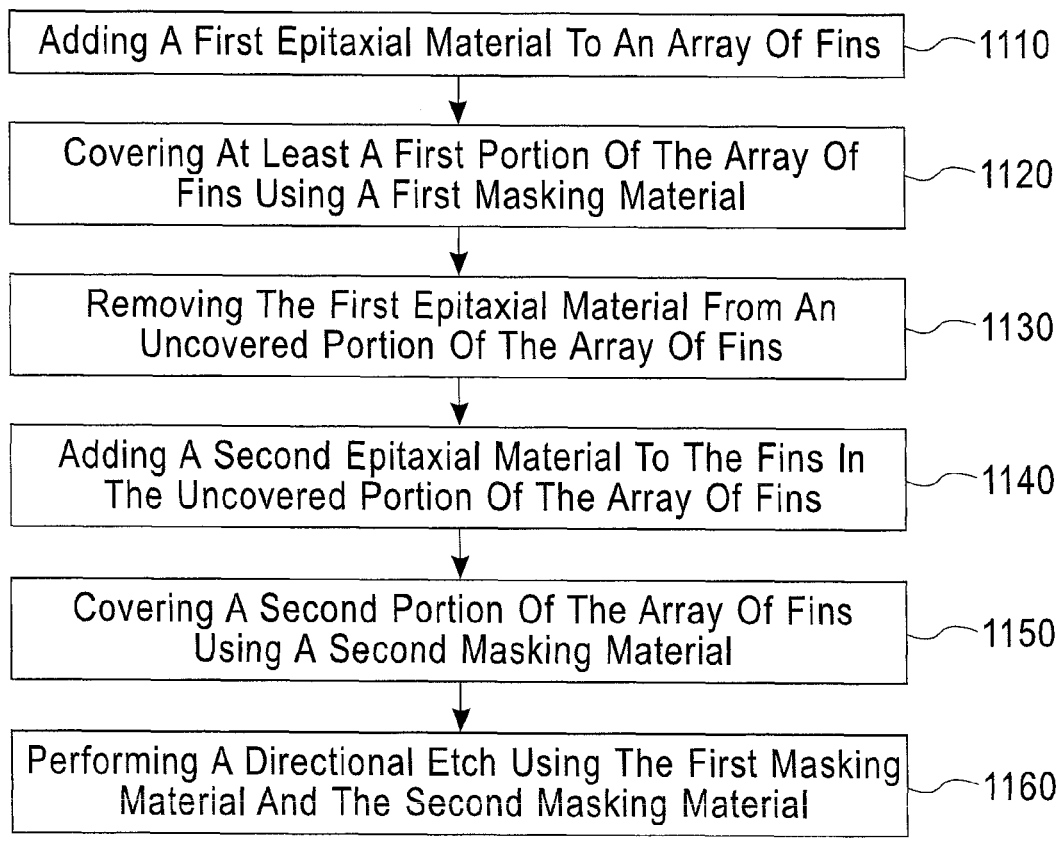
FIG. 11 is a logic flow diagram that illustrates the operation of an exemplary method, and a result of execution of computer program instructions embodied on a computer readable memory, in accordance with various exemplary embodiments.

FIG. 11 is a logic flow diagram that illustrates the operation of a method, and a result of execution of computer program instructions (such as PROG 1018), in accordance with exemplary embodiments. In accordance with these exemplary embodiments a method performs, at Block 1110, a step of adding a first epitaxial material to an array of fins. A step of covering at least a first portion of the array of fins using a first masking material is performed by the method at Block 1120. The method performs a step of removing the first epitaxial material from an uncovered portion of the array of fins at Block 1130. At Block 1140, the method performs a step of adding a second epitaxial material to the fins in the uncovered portion of the array of fins. A step of covering a second portion of the array of fins using a second masking material is performed by the method at Block 1150. The method performs a step of performing a directional etch using the first masking material and the second masking material at Block 1160.

The various blocks shown in FIG. 11 may be viewed as method steps, and/or as operations that result from operation of computer program code, and/or as a plurality of coupled logic circuit elements constructed to carry out the associated function(s).

An exemplary embodiment provides a method for making dual-epi FinFETs. The method includes adding a first epitaxial material to an array of fins. The method also includes covering at least a first portion of the array of fins using a first masking material and removing the first epitaxial material from an uncovered portion of the array of fins. Adding a second epitaxial material to the fins in the uncovered portion of the array of fins is included in the method. The method also includes covering a second portion of the array of fins using a second masking material and performing a directional etch using the first masking material and the second masking material.

In a further exemplary embodiment of the method above, the method also includes performing a reactive ion etch.

In another exemplary embodiment of any one of the methods above, the first epitaxial material is SiGe, in-situ B-doped (ISBD) SiGe and/or Indium doped SiGe.

In a further exemplary embodiment of any one of the methods above, the second epitaxial material is p-doped Si or undoped silicon. If undoped silicon is used, it may be doped after the cut, for example, using Arsenic.

In another exemplary embodiment of any one of the methods above, the first masking material is a nitride deposition, a thin oxide film, an oxy-nitride film or a carbon containing silicon nitride film.

In a further exemplary embodiment of any one of the methods above, the second masking material is a resist film, an organic planarizing layer, a silicon layer containing an anti-reflection coating and a resist, and/or a multi-layer stack.

In another exemplary embodiment of any one of the methods above, the method also includes, in response to covering at least the first portion of the merged array of fins using the first masking material, removing the first masking material from a second portion of the merged array of fins.

In a further exemplary embodiment of any one of the methods above, removing the first epitaxial material includes removing the first epitaxial using an HCl etch.

In another exemplary embodiment of any one of the methods above, removing the first epitaxial material and adding the second epitaxial material is performed in a single step on an epi-platform.

In a further exemplary embodiment of any one of the methods above, performing the directional etch removes at least one fin in the array of fins.

Another exemplary embodiment provides an apparatus for making dual-epi FinFETs. The apparatus includes a processor and a memory storing program instructions. The memory and the program instructions are configured to, with the processor, cause the apparatus to perform actions. The actions include adding a first epitaxial material to an array of fins. The actions also include covering at least a first portion of the array of fins using a first masking material and removing the first epitaxial material from an uncovered portion of the array of fins. Adding a second epitaxial material to the fins in the uncovered portion of the array of fins is included in the actions. The actions also include covering a second portion of the array of fins using a second masking material and performing a directional etch using the first masking material and the second masking material.

In a further exemplary embodiment of the apparatus above, the actions also include performing a reactive ion etch.

In another exemplary embodiment of any one of the apparatus above, the first epitaxial material is SiGe, in-situ B-doped (ISBD) SiGe and/or Indium doped SiGe.

In a further exemplary embodiment of any one of the apparatus above, the second epitaxial material is p-doped Si or undoped silicon. If undoped silicon is used, it may be doped after the cut, for example, using Arsenic.

In another exemplary embodiment of any one of the apparatus above, the first masking material is a nitride deposition, a thin oxide film, an oxy-nitride film or a carbon containing silicon nitride film.

In a further exemplary embodiment of any one of the apparatus above, the second masking material is a resist film, an organic planarizing layer, a silicon layer containing an anti-reflection coating and a resist, and/or a multi-layer stack.

In another exemplary embodiment of any one of the apparatus above, the actions also include, in response to covering at least the first portion of the merged array of fins using the first masking material, removing the first masking material from a second portion of the merged array of fins.

In a further exemplary embodiment of any one of the apparatus above, removing the first epitaxial material includes removing the first epitaxial using an HCl etch.

In another exemplary embodiment of any one of the apparatus above, removing the first epitaxial material and adding the second epitaxial material is performed in a single step on an epi-platform.

In a further exemplary embodiment of any one of the apparatus above, performing the directional etch removes at least one fin in the array of fins.

In another exemplary embodiment of any one of the apparatus above, the apparatus is embodied in an application-specific integrated circuit.

In a further exemplary embodiment of any one of the apparatus above, the apparatus is embodied in an integrated circuit.

Another exemplary embodiment provides a computer program product for making dual-epi FinFETs. The computer program product includes program instructions embodied on a tangible computer-readable medium, execution of the program instructions resulting in operations. The operations include adding a first epitaxial material to an array of fins. The operations also include covering at least a first portion of the array of fins using a first masking material and removing the first epitaxial material from an uncovered portion of the array of fins. Adding a second epitaxial material to the fins in the uncovered portion of the array of fins is included in the operations. The operations also include covering a second portion of the array of fins using a second masking material and performing a directional etch using the first masking material and the second masking material.

In a further exemplary embodiment of the computer program product above, the operations also include performing a reactive ion etch.

In another exemplary embodiment of any one of the computer program products above, the first epitaxial material is SiGe, in-situ B-doped (ISBD) SiGe and/or Indium doped SiGe.

In a further exemplary embodiment of any one of the computer program products above, the second epitaxial material is p-doped Si or undoped silicon. If undoped silicon is used, it may be doped after the cut, for example, using Arsenic.

In another exemplary embodiment of any one of the computer program products above, the first masking material is a nitride deposition, a thin oxide film, an oxy-nitride film or a carbon containing silicon nitride film.

In a further exemplary embodiment of any one of the computer program products above, the second masking material is a resist film, an organic planarizing layer, a silicon layer containing an anti-reflection coating and a resist, and/or a multi-layer stack.

In another exemplary embodiment of any one of the computer program products above, the operations also include, in response to covering at least the first portion of the merged array of fins using the first masking material, removing the first masking material from a second portion of the merged array of fins.

In a further exemplary embodiment of any one of the computer program products above, removing the first epitaxial material includes removing the first epitaxial using an HCl etch.

In another exemplary embodiment of any one of the computer program products above, removing the first epitaxial material and adding the second epitaxial material is performed in a single step on an epi-platform.

In a further exemplary embodiment of any one of the computer program products above, performing the directional etch removes at least one fin in the array of fins.

In another exemplary embodiment of any one of the computer program products above, the computer-readable medium is a non-transitory computer readable medium (e.g., CD-ROM, RAM, flash memory, etc.).

In a further exemplary embodiment of any one of the computer program products above, the computer-readable medium is a storage medium.

Another exemplary embodiment provides an apparatus for making dual-epi FinFETs. The apparatus includes means for adding a first epitaxial material to an array of fins. The apparatus also includes means for covering at least a first portion of the array of fins using a first masking material and means for removing the first epitaxial material from an uncovered portion of the array of fins. Means for adding a second epitaxial material to the fins in the uncovered portion of the array of fins is included in the apparatus. The apparatus also includes means for covering a second portion of the array of fins using a second masking material and means for performing a directional etch using the first masking material and the second masking material.

In a further exemplary embodiment of the apparatus above, the apparatus also includes means for performing a reactive ion etch.

In another exemplary embodiment of any one of the apparatus above, the first epitaxial material is SiGe, in-situ B-doped (ISBD) SiGe and/or Indium doped SiGe.

In a further exemplary embodiment of any one of the apparatus above, the second epitaxial material is p-doped Si or undoped silicon. If undoped silicon is used, it may be doped after the cut, for example, using Arsenic.

In another exemplary embodiment of any one of the apparatus above, the first masking material is a nitride deposition, a thin oxide film, an oxy-nitride film or a carbon containing silicon nitride film.

In a further exemplary embodiment of any one of the apparatus above, the second masking material is a resist film, an organic planarizing layer, a silicon layer containing an anti-reflection coating and a resist, and/or a multi-layer stack.

In another exemplary embodiment of any one of the apparatus above, the apparatus also includes means for removing the first masking material from a second portion of the merged array of fins in response to covering at least the first portion of the merged array of fins using the first masking material.

In a further exemplary embodiment of any one of the apparatus above, the means for removing the first epitaxial material includes means for removing the first epitaxial using an HCl etch.

In another exemplary embodiment of any one of the apparatus above, where the means for removing the first epitaxial material and the means for adding the second epitaxial material are configured to operate in a single step on an epi-platform.

In a further exemplary embodiment of any one of the apparatus above, performing the directional etch removes at least one fin in the array of fins.

Any use of the terms "connected", "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out various exemplary embodiments. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments.

Furthermore, some of the features of the preferred embodiments could be used to advantage without the corresponding use of other features. As such, the foregoing description should be considered as merely illustrative of the principles, and not in limitation thereof.

What is claimed is:

1. An apparatus comprising at least one data processor, wherein the at least one data processor is operable to perform operations comprising:
   to add a first epitaxial material to an array of fins;
   to cover at least a first portion of the array of fins using a first masking material;
   to remove the first epitaxial material from an uncovered portion of the array of fins;
   to add a second epitaxial material to the fins in the uncovered portion of the array of fins;
   to cover a second portion of the array of fins using a second masking material; and
   to perform a directional etch using the first masking material and the second masking material.

2. The apparatus as in claim 1, where the operations further comprise to perform a reactive ion etch.

3. The apparatus as in claim 1, where the first epitaxial material is one of: SiGe, in-situ B-doped (ISBD) SiGe and Indium doped SiGe.

4. The apparatus as in claim 1, where the second epitaxial material is p-doped Si or undoped silicon.

5. The apparatus as in claim 1, where the first masking material is one of: a nitride deposition, a thin oxide film, an oxy-nitride film and a carbon containing silicon nitride film.

6. The apparatus as in claim 1, where the second masking material is one of: a resist film, an organic planarizing layer, a silicon layer containing an anti-reflection coating and a resist, and a multi-layer stack.

7. The apparatus as in claim 1, where the operations further comprise, in response to covering at least the first portion of the merged array of fins using the first masking material, to remove the first masking material from a second portion of the merged array of fins.

8. The apparatus as in claim 1, when removing the first epitaxial material, the operations further comprise to remove the first epitaxial using an HCl etch.

9. The apparatus as in claim 1, when performing the directional etch, the operations further comprise to remove at least one fin in the array of fins.

10. The apparatus as in claim 1, where the second epitaxial material is undoped silicon and the operations further comprise, in response to performing the directional etch, to dope the second epitaxial material.

11. An apparatus comprising:
    means for adding a first epitaxial material to an array of fins;
    means for covering at least a first portion of the array of fins using a first masking material;
    means for removing the first epitaxial material from an uncovered portion of the array of fins;
    means for adding a second epitaxial material to the fins in the uncovered portion of the array of fins;
    means for covering a second portion of the array of fins using a second masking material; and
    means for performing a directional etch using the first masking material and the second masking material.

12. The apparatus as in claim 11, further comprising means for performing a reactive ion etch.

13. The apparatus as in claim 11, where the first epitaxial material is one of: SiGe, in-situ B-doped (ISBD) SiGe and Indium doped SiGe.

14. The apparatus as in claim 11, where the second epitaxial material is p-doped Si or undoped silicon.

15. The apparatus as in claim 11, where the first masking material is one of: a nitride deposition, a thin oxide film, an oxy-nitride film and a carbon containing silicon nitride film.

16. The apparatus as in claim 11, where the second masking material is one of: a resist film, an organic planarizing layer, a silicon layer containing an anti-reflection coating and a resist, and a multi-layer stack.

17. The apparatus as in claim 11, further comprising means for removing the first masking material from a second portion of the merged array of fins in response to covering at least the first portion of the merged array of fins using the first masking material.

18. The apparatus as in claim 11, where the first epitaxial material removing means comprises means for removing the first epitaxial using an HCl etch.

19. The apparatus as in claim 11, the directional etch performing means further comprises means for removing at least one fin in the array of fins.

20. The apparatus as in claim 11, where the second epitaxial material is undoped silicon and the apparatus further comprises means for doping the second epitaxial material in response to performing the directional etch.

\* \* \* \* \*